000
United States Patent [19]

Loeffler et al.

[11] Patent Number: 4,703,271

[45] Date of Patent: Oct. 27, 1987

[54] NMR TOMOGRAPHIC APPARATUS

[75] Inventors: Wilfried Loeffler, Herzogenaurach; Arnulf Oppelt, Buckenhof, both of Fed. Rep. of Germany

[73] Assignee: Siemens Aktiengesellschaft, Berlin and Munich, Fed. Rep. of Germany

[21] Appl. No.: 666,656

[22] Filed: Oct. 31, 1984

[30] Foreign Application Priority Data

Nov. 9, 1983 [DE] Fed. Rep. of Germany ....... 3340523

[51] Int. Cl.$^4$ .......................................... G01R 33/20
[52] U.S. Cl. .................................... 324/309; 324/314
[58] Field of Search ................ 324/307, 309, 314, 312

[56] References Cited

U.S. PATENT DOCUMENTS

| 3,569,823 | 3/1971 | Golay | 324/320 |
|---|---|---|---|
| 4,070,611 | 1/1978 | Ernst | 324/309 |
| 4,431,968 | 2/1984 | Edelstein et al. | 324/309 |
| 4,443,760 | 4/1984 | Edelstein et al. | 324/314 |
| 4,506,222 | 3/1985 | Edelstein et al. | 324/309 |
| 4,506,223 | 3/1985 | Bottomley et al. | 324/309 |
| 4,593,247 | 6/1986 | Glover | 324/309 |

FOREIGN PATENT DOCUMENTS 3135335  8/1983  Fed. Rep. of Germany .

Primary Examiner—Stewart J. Levy
Assistant Examiner—Kevin D. O'Shea
Attorney, Agent, or Firm—Hill, Van Santen, Steadman & Simpson

[57] ABSTRACT

The disclosure relates to an NMR tomographic apparatus wherein an improved local resolution is obtained in a selected segment of the examination region. To this end, in a spin-echo-sequence in conjunction with a 90°-Hf-pulse, a first field gradient is generated in one direction for a spatial selection of a first dimension of the segment which is energized to precession and hence signal emission. In an excitation interval with a 180°-Hf-pulse, a second field gradient is generated in a second direction perpendicular to the first cited direction, for achieving a spatial selection of a second dimension of the segment contributing to the echo signal. The echo signal is read out in the presence of a third field gradient which, in turn, is perpendicular to the first and second field gradients. A three dimensional Fourier-Zeugmatography data set for the representation of a series of layers can be picked-up. In addition, it is possible to represent a non-central region. Finally, a zoom imaging is provided such that any selected plural layer volume of the initially selected segment of the examination region can be imaged with increased resolution.

7 Claims, 13 Drawing Figures

NMR TOMOGRAPHIC APPARATUS

BACKGROUND OF THE INVENTION

The invention relates to an NMR tomographic apparatus for the image-representation of interior regions of an examination subject, wherein a basic magnetic field and gradient magnetic fields and high-frequency magnetic excitation pulses (90°-Hf-pulse and 180°-Hf-pulse) are applied for effecting the deflection of the atomic nuclei of the examination subject from their state of equilibrium at a selected amount of the interior region.

An apparatus of this type is described in the British specification No. 2,113,399 corresponding to U.S. Pat. Nos. 4,599,565 and 4,471,305.

SUMMARY OF THE INVENTION

The object underlying the invention resides in designing an apparatus of the initially cited type in such a manner that a representation of a selected segment of a region under examination is rendered possible with improved local resolution (Zoom).

In accordance with the invention, this object is achieved in that a three-dimensional imaging sequence is applied which energizes to resonance a partial volume of interest within the region available for examination by means of selective high frequency pulses, and which then subjects the partial volume, by means of orthogonal field gradients, to a three-dimensional imaging procedure, so that this partial volume or selected segment is accessible with isotropic or anisotropic resolution. In the case of the inventive apparatus, in a spin-echo-sequence, during the 90°-Hf-pulse, a field gradient is produced (referenced in the following with $G_z$) in one direction (referenced in the following with z) for a spatial restriction (selection) of the partial volume energized to precession and hence signal emission; during the 180°-Hf-pulse, a field gradient is produced (in the following referenced with $G_y$) in a second direction perpendicular to the first-cited direction (in the folllowing referenced with y), which effects a spatial limitation (selection) of the partial volume contributing to the echo signal in the second direction; and the echo signal is read out in the presence of a third field gradient (in the following referenced with $G_x$) which, in turn, is perpendicular to the two first - cited directions. In the case of the inventive apparatus, a representation of partial regions of the examination subject proceeds in such a manner that a cuboid is selected in the overall available examination region whose edge length $L_z$ is the z-direction is given by the bandwidth of the 90°-pulse and whose position in the z-direction is given by the frequency values of the 90°-pulse, whose edge length $L_y$ in the y-direction is given by the bandwidth of the 180°-pulse and whose position is y-direction is given by the frequency values of the 180°-pulse and whose edge length $L_x$ and position in the x-direction is defined by a bandpass filter connected at the output side of a signal demodulator.

The described apparatus renders possible the representation of selected segments from an available examination region with nuclear magnetic resonance with an increased local resolution, utilizing conventional—i.e. 128 - or 256—, two dimensional or three dimensional measuring matrices. In the first instance, the bandwidth of the 90°-pulse will be selected corresponding to the thickness of the desired imaging layer and a two dimensional Fourier imaging procedure will be employed. In the second instance, a three dimensional Fourier imaging procedure will be selected corresponding to the thickness of the entire desired imaging region. The later procedure is particularly advisable in the case of representation of curved objects, e.g. the spinal column, or large vessels whose spatial progression departs from a flat plane layer.

Embodiments of the invention will be apparent from the claims in conjunction with the following description on the basis of the accompanying sheets of drawings; and other objects, features and advantages will be apparent from this detailed disclosure and from the appended claims.

DETAILED DESCRIPTION

Figure 1:
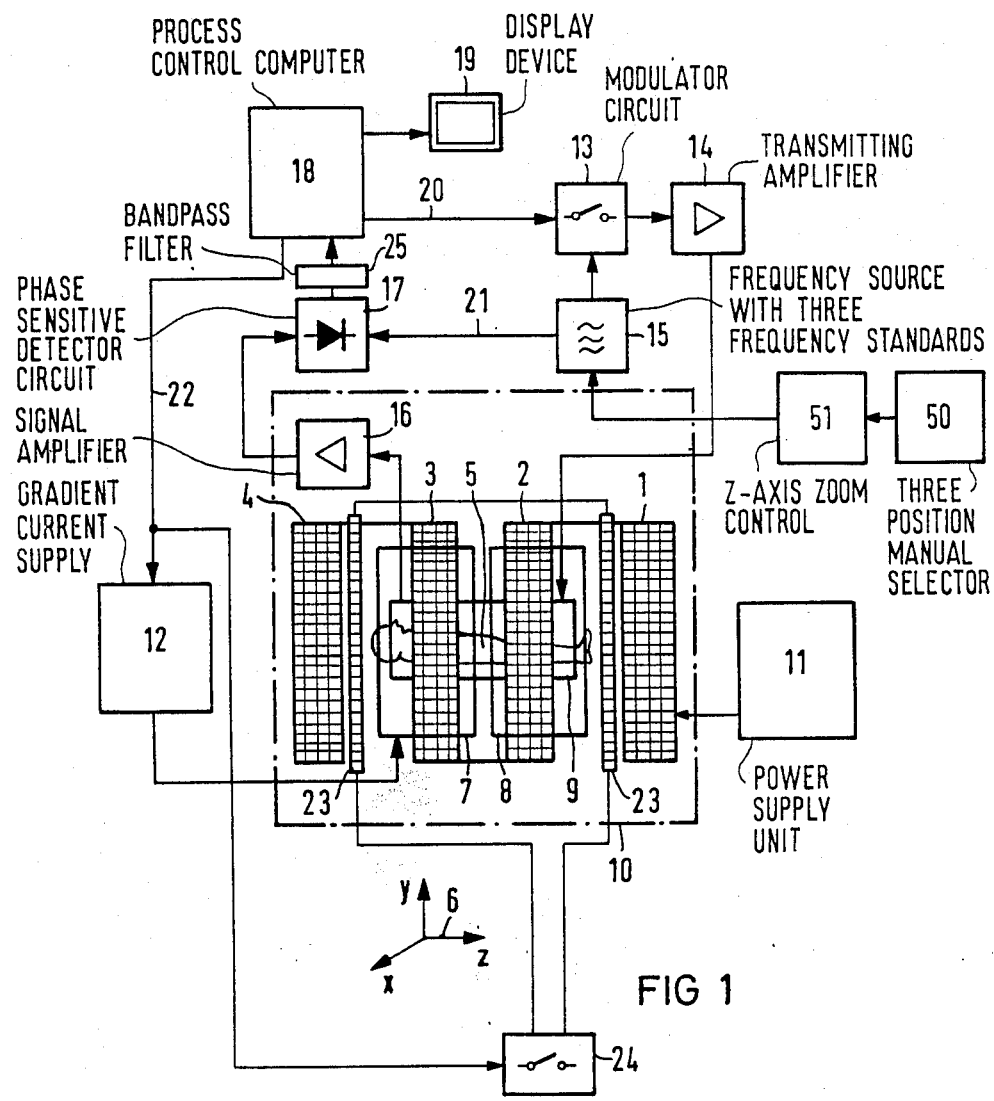
FIG. 1 illustrates an NMR tomographic apparatus in order to explain the inventive idea.

In FIG. 1, coils 1, 2, 3 and 4 are indicated for producing a DC magnetic polarizing field $B_o$. Where the apparatus is used for medical diagnostic imaging, the body 5 of a patient to be examined is disposed within the field region as indicated in FIG. 1. In addition, gradient coils are associated with said patient, which are provided for the generation of independent mutually perpendicular magnetic field gradients in respective directions x, y, z which may be oriented as indicated at 6. In FIG. 1, for reasons of clarity, only gradient coils 7 and 8 are illustrated which, together with a pair of opposite, like gradient coils, serve the purpose of generating a magnetic field gradient in the x direction. The similar, non-illustrated y-gradient coils lie parallel to the body 5 and above and below the patient receiving space, while the z-gradient coils lie in planes disposed transversely to the axis of the patient receiving space at the head and foot ends, respectively. The arrangement moreover contains a high frequency coil 9 serving the purpose of excitation of nuclear magnetic resonance and pick-up of the nuclear magnetic resonance signals.

The coils 1 through 9, bounded by a dash/dot line 10, represent the actual examination apparatus. It is operated from an electric circuit arrangement which comprises a power supply unit 11 for the operation of the coils 1–4 as well as a gradient current supply 12 to which the gradient coils 7 and 8, as well as the additional gradient coils, are connected. The coil 9, serving both the purpose of excitation as well as the purpose of picking-up the signal is connected, on the one hand, with a high frequency oscillator 15 via a modulator 13 and a transmitting amplifier 14, and, on the other hand, is connected with a process control computer 18, via a signal amplifier 16 and a phase-sensitive rectifier 17. The control computer 18 may supply an output image signal to a display screen device 19 to produce a visual display of the processed image. For the control of the arrangement, moreover, connections 20, 21, and 22 are provided between the computer 18 and the modulator 13, between the oscillator 15 and the phase sensitive rectifier 17, and between the computer 18 and the gradient current supply 12. The basic method of operation of an apparatus of FIG. 1 is described in the German Offenlegungsschrift No. 31 35 335 published Aug. 18, 1983 corresponding to U.S. Pat. No. 4,520,315.

Figure 2:
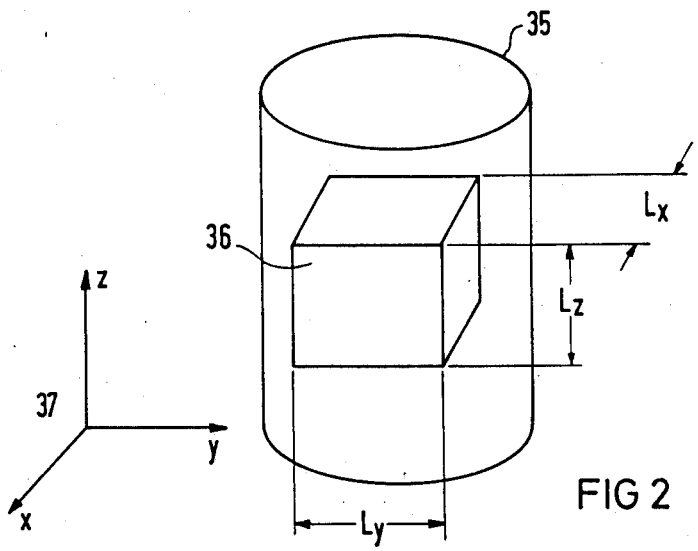
FIGS. 2 and 3 show graphic illustrations in order to explain FIG. 1.
Figure 3:
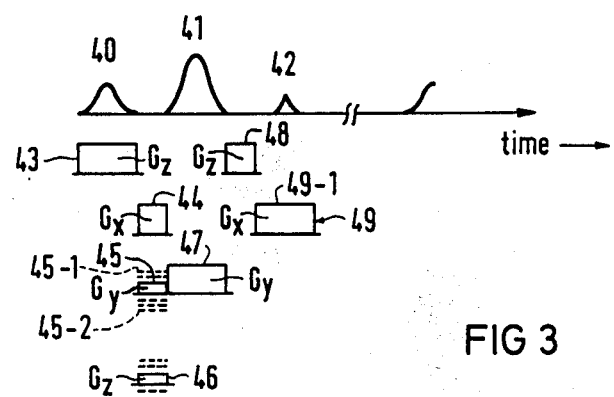

In FIG. 2, a region of an examination subject is indicated at 35 which represents the portion of body 5 within the examination space of the apparatus 10 of FIG. 1. FIG. 2 also indicates a selected partial volume or segment 36 to be imaged and includes a diagram 37 which indicates the three spatial directions. FIG. 3 represents the high frequency—and gradient—switching sequence which renders possible the imaging of the desired partial volume such as 36. A spin-echo-sequence is employed in which, during the 90°-Hf-pulse 40, which is generated by the high frequency coil 9, a field gradient $G_z$ is present as indicated by pulse waveform 43, FIG. 3, as a consequence of which a selection of a length $L_z$ defining a dimension of the partial volume 36, takes place, the section of length $L_z$ being energized to precession and hence to signal emission. A phase then occurs (at the end of gradient pulse 43) in which a fixed gradient $G_x$ is produced as represented by fixed amplitude pulse waveform 44, and variable gradients $G_y$ and $G_z$ are superimposed as represented by the variable amplitude pulse waveforms 45 and 46 (which are applied to the y-axis and z-axis gradient coils). The sequence of pulses 43, and 44, 45, 46, is repeated with a constant amplitude of pulse 44, but varying amplitudes of pulses 45 and 46 as indicated by the dash lines associated with pulses 45 and 56 in FIG. 3, from sequence repetition to repetition, so that the magnetization is rephased. Subsequently, a 180°-Hf-pulse 41 follows, likewise generated by the high frequency coil 9, while a field gradient $G_y$ produced by a pulse 47 is effective. The latter limits the imaging of the partial volume 36 to the length $L_y$. A rephasing gradient $G_z$ produced by a pulse 48 subsequently follows which eliminates an interfering phase/frequency characteristic (or phase response) via $L_z$. Subsequently an echo 42 in the presence of the gradient $G_x$ produced by pulse 49 is read out. The signal, rectified in a phase-sensitive manner in component 17, FIG. 1, is sent through a bandpass filter 25 whose bandwidth limits the desired partial volume or segment 36 to the length $L_x$.

If the spin-echo-sequence is repeated $N_y$-times with varying gradients $G_y$ having successive pulse amplitudes as indicated at 45 and $N_z$- times with varying gradients $G_z$ as indicated at 46, and if $N_x$ equidistant signal points are obtained in each echo, the desired selected segment 36 of region 35 can be reconstructed to an $N_z$ times $N_y$ times $N_x$-matrix. The local resolution in the z-direction then is equal to $L_z/N_z$, in y-direction is equal to $L_y/N_y$, and in x-direction is equal to $L_x/N_x$. An enlargement of the gradients $G_x$, $G_y$, $G_z$ (by increasing the peak amplitudes at 43, 47 and 49) increases the total resolution and reduces $L_x$, $L_y$, $L_z$ (zooming). It is clear from the foregoing that, in the case of utilizing the same size measuring matrix for the entire available examination region (e.g. as represented at 35, FIG. 2), the local resolution is strongly reduced; or a substantially larger measuring matrix with a correspondingly prolonged measuring time would have to be employed.

If $N_z = 1$ is selected and $L_z$ is selected corresponding to the desired image layer thickness, the gradient $G_z$ produced by pulse 46 can be dispensed with and a two dimensional image in a $N_x$ times $N_y$- matrix is obtained. Through enlargement of the gradient intensity $G_x$ and $G_y$ a zoom can also here be created.

If non-central segments of the examination region 35 are to be represented, then the frequency of the selective 90°-pulse 40 and of the selective 180°-pulse 41 must be correspondingly selected and the median frequency of the bandpass filter 25 must be correspondingly adjusted.

For the selection of the frequency of the 90°-and 180°-pulses, various frequency standards, synchronized with one another, can be utilized. Instead of shifting the image frequency of the bandpass filter, also the reference frequency (at input 21, FIG. 1) of the phase-sensitive rectifier 17 can be adjusted, and a simple low pass filter can be employed. Instead of three frequency standards, however, also a rapidly switchable single frequency standard can be employed.

By way of example, a three position manual detector 50 may control a z-axis zoom control 51 so as to select a desired one of the three frequency standards of source 15 for activation in conjunction with RF pulse 40 so that any one of three partial volumes of the total volume of segment 36 may be selected for imaging with increased resolution.

However, it is also possible to obtain the image of a non-central segment through utilization of a single sideband modulator for the generation of the selective pulse, which permits not only the specification of the envelope of the Hf-pulses, but also the variation of the median frequency of these pulses.

A spatially constant additional field can be generated by coils 23, the additional field of being switched on and off rapidly by switching unit 24. By positive or negative connection to the x-, y-, or z-gradient field, the plane in which the magnetic field remains unaltered can be randomly shifted for each of the three gradients. A representation of eccentric segments oblique to the axes x, y, and/or z is thus likewise possible. The geometric shape for coils suited for this purpose is described in the German AS No. 19 46 059 (U.S. Pat. No. 3,569,823 issued Mar. 9, 1971).

It will be apparent that many modifications and variations may be made without departing from the scope of the teachings and concepts of the present invention.

We claim as our invention:

1. An NMR tomography apparatus for representing by spin-echo techniques images of selected cuboid segments of an examination region occuped by an examination subject, said apparatus comprising:

means for generating a basic magnetic field in said region;

means for generating three gradient magnetic fields in three respective directions which are orthogonal in said regions;

means for generating high frequency pulses for deflecting atomic nuclei in said selected segment from an equilibrium position in the presence of said basic and gradient magnetic fields;

means for controlling said means for generating said gradient fields and said means for generating said high frequency pulses, said means for controlling causing said means for generating high frequency pulses to generate a 90° pulse and a 180° pulse, and said means for controlling also causing said means for generating said gradient fields to generate a gradient field in a first direction during said 90° pulse for spatially limiting the volume of said region wherein said atomic nuclei are energized to precession and signal emission, and causing said means for generating gradient fields to generate a gradient field in a second direction, perpendicular to said first direction, during said 180° pulse for spatially limiting a partial volume of said region in said second direction in which said atomic nuclei are energized to precession and signal emission; and means for detecting the resonant frequency of said atomic nuclei in a third direction perpendicular to each of said first and second directions during return of said nuclei to said equilibrium position upon removal of said high frequency pulses.

2. An apparatus as claimed in claim 1, wherein said means for detecting acquires a three-dimensional Fourier-Zeugmatography data set for a series of layers respectively parallel to surfaces of said cuboid.

3. An apparatus as claimed in claim 1, wherein said means for generating high frequency pulses has synchronized frequency standards for selectively controlling the median frequency of said high frequency pulses and thereby controlling the locus of said selected segment within said region.

4. An apparatus as claimed in claim 1, wherein said means for generating high frequency pulses includes a rapidly switchable frequency standard for altering the median frequency of the high frequency pulses and thereby controlling the locus of said selected segment within said region.

5. An apparatus as claimed in claim 1, wherein said means for generating high frequency pulses includes a modulator for generating selected pulses for selecting an envelope of high frequency pulses for thereby varying the median frequency of said high frequency pulses.

6. An apparatus as claimed in claim 1, further comprising means for generating an additional uniform magnetic field and means for rapidly switching off said uniform magnetic field for superimposing said additional uniform magnetic field on at least one of said gradient fields for shifting the respective direction of the gradient field on which said additional uniform magnetic field is superimposed.

7. A method for operating a NMR tomography apparatus for representing by spin-echo technique images of selected cuboid segments of an examination region occupied by an examination subject, said method comprising the steps of:

generating a basic magnetic field in said region;

generating a 90° high frequency pulse for deflecting atomic nuclei in said selected segment from an equilibrium position in the presence of said basic magnetic field and simultaneously generating a gradient magnetic field in a first direction for spatially limiting the volume of said region wherein said atomic nuclei are energized to precession and signal emission;

generating a 180° high frequency pulse for deflecting atomic nuclei in said selected segment from an equilibrium position in the presence of said basic magnetic field and simultaneously generating a gradient magnetic field in a second direction, perpendicular to said first direction, for spatially limiting a partial volume of said region in said second direction in which said atomic nuclei are energized to precession and signal emission; and detecting the resonant frequency of said atomic nuclei in the presence of a gradient magnetic field in a third direction perpendicular to each of said first and second directions during return of said nuclei to said equilibrium position upon removal of said high frequency pulses.

* * * * *